United States Patent
Echigo et al.

[11] Patent Number: 5,946,554
[45] Date of Patent: Aug. 31, 1999

[54] METHOD OF PRODUCING RESIN-SEALED ELECTRONIC DEVICE

[75] Inventors: Masashi Echigo, Kariya; Hiroyuki Yamakawa, Okazaki, both of Japan

[73] Assignee: Denso Corporation, Kariya, Japan

[21] Appl. No.: 08/863,398

[22] Filed: May 27, 1997

[30] Foreign Application Priority Data

May 28, 1996 [JP] Japan .................................. 8-133858
Mar. 19, 1997 [JP] Japan .................................. 9-066304

[51] Int. Cl.$^6$ .......................... H01L 21/44; H01L 21/48; H01L 21/50
[52] U.S. Cl. .......................... 438/119; 438/118; 438/126
[58] Field of Search .................................. 438/119, 118, 438/126

[56] References Cited

U.S. PATENT DOCUMENTS

| | | | |
|---|---|---|---|
| 5,139,969 | 8/1992 | Mori | 438/613 |
| 5,173,765 | 12/1992 | Nakayashi et al. | 438/119 |
| 5,424,254 | 6/1995 | Damiot | 438/106 |
| 5,471,027 | 11/1995 | Call et al. | 438/118 |
| 5,514,912 | 5/1996 | Ogashiwa | 438/106 |
| 5,665,651 | 9/1997 | Asada et al. | 438/123 |
| 5,731,231 | 3/1998 | Miyajima | 438/123 |

FOREIGN PATENT DOCUMENTS

| | | |
|---|---|---|
| 58-015261 | 1/1983 | Japan . |
| 60-001220 | 1/1985 | Japan . |
| 6-232457 | 8/1994 | Japan . |

*Primary Examiner*—Kevin M. Picardat
*Assistant Examiner*—Deven Collins
*Attorney, Agent, or Firm*—Pillsbury Madison & Sutro LLP

[57] ABSTRACT

In a method of producing a resin-sealed electronic device, a solder resist layer including a silicone family surfactant is coated on a printed circuit board. Thereafter, an electronic component is mounted on the solder resist layer through adhesives, and is sealed by sealing resin. The content of the silicone family surfactant in the solder resist layer is less than 3 wt %, more preferably, is in a range of 0.2 wt % to 1 wt %. Accordingly, adhering reliability of the sealing resin relative to the solder resist can be improved, thereby resulting in high reliability of the resin-sealed electronic device for a long time.

25 Claims, 7 Drawing Sheets

FIG. 1
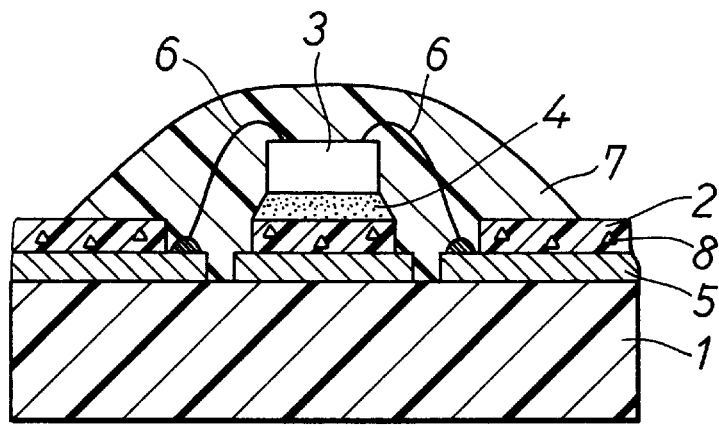
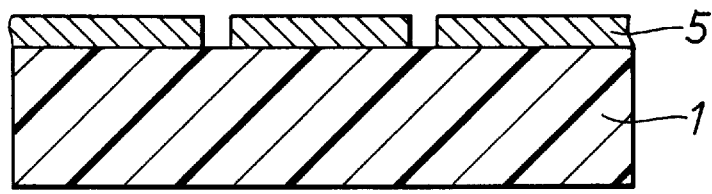
FIG. 2A
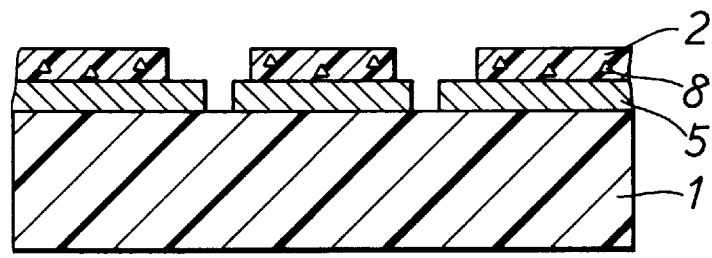
FIG. 2B
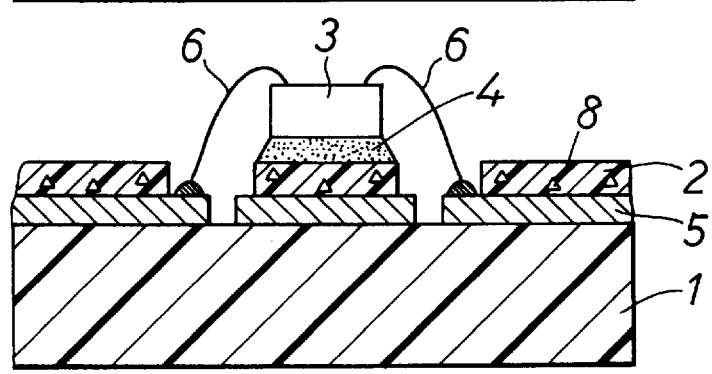
FIG. 2C

METHOD OF PRODUCING RESIN-SEALED ELECTRONIC DEVICE

CROSS REFERENCE TO RELATED APPLICATIONS

This application is based upon and claims the benefit of priority of the prior Japanese Patent Applications No. 8-133858 filed on May 28, 1996, and No. 9-66304 filed on Mar. 19, 1997, the contents of which are incorporated herein by reference.

BACKGROUND OF THE INVENTION

1. Field of the Invention

The present invention relates to a method of producing a resin-sealed electronic device.

2. Related Arts

In recent years, as shown in FIGS. 15 and 16, an electronic component 21 such as a semiconductor device or the like is directly mounted on a circuit board 22 to comply with miniaturization and densification requirements for an electronic device. In more detail, as shown in FIG. 15, is a case where the electronic component 21 is mechanically bonded to the circuit board 22 by adhesives 23, and thereafter, it is electrically connected to electrodes formed on the circuit board 22 by bonding wires 24. Further, as shown in FIG. 16, the electronic component 21 is bonded to the circuit board 22 by utilizing solder (conductive adhesives, or a conductive adhesive film) 25 so that mechanical fixation and electrical connection between the electronic component 21 and the circuit board 22 are attained at the same time. In either case, the electronic component 21 is sealed by sealing resin 26. The objects of the sealing are to improve junction reliability between the electronic component 21 and the circuit board 22, thermal stress-resistant reliability and moisture-resistant reliability of the electronic component 21. Further, the other object of the sealing is to mechanically protect the electronic component 21. Here, to attain the above-mentioned objects, it is necessary that the sealing resin 26 reliably adheres to the bonding wires 24, to the bonding member such as the solder 25, as well as to the surface of the circuit board 22.

In general, contaminants and the like are less likely to attach to the surfaces of the bonding wires, the solder, and the electronic component. Therefore, adhering reliability of the sealing resin relative to the bonding wires, the solder, and the electronic component is typically not problematic. As opposed to this, in many cases, adhering reliability of the sealing resin relative to the circuit board is not sufficient. In particular, in the case where the circuit board is made of resin, some components included in the circuit board seep out on the surface of the circuit board, thereby deteriorating the adhering reliability of the sealing resin to the circuit board.

In addition, a printed circuit board including paper-phenol base material or glass-epoxy base material is often employed as the circuit board because of its characteristics and cost. On the printed circuit board, as shown in FIG. 17, an electronic component is mounted through a patterned copper layer 30 and a solder resist layer 27. The solder resist layer 27 is coated on the copper layer 30 in order to prevent the oxidation of the copper layer 30 and to prevent the adhesion of solder, which is used to mount the electronic component, to unnecessary portions. In this structure, an adhering area of the sealing resin 29 relative to the solder resist layer 27 is large, and the adhering strength of the sealing resin 29 relative to the solder resist layer 27 is greatly affected by the material of the solder resist layer 27.

To form the solder resist layer 27, liquid resist material is coated on the circuit board 22 to cover the copper layer 30, and then, is hardened by heating or ultraviolet irradiation. When coating the liquid resist material, however, foam is liable to occur so that pin-holes are caused in the solder resist layer 27. To prevent this problem, it is known that a silicone family surfactant 28 (indicated by white triangles in FIG. 17) such as polydimethylsiloxane or the like is added to the solder resist layer 27 as an antifoaming agent. However, this silicone family surfactant 28 deteriorates the adhering strength with respect to the sealing resin.

JP-A-58-15261 and JP-A-60-1220 propose methods for improving characteristics of the sealing resin. However, the adhesive properties of the sealing resin relative to the solder resist is not sufficient. For example, when performing a thermal shock cycle test or a high-temperature and high-humidity storage test, in many cases, separation of the solder resist from the sealing resin occurs. The separation of the sealing resin is accompanied by breakdowns of the electronic component, breakdowns of the connecting portions between the electronic component and the circuit board, and invasion of water into the separated portions which causes corrosion. As a result, reliability of the electronic component is largely deteriorated.

As opposed to the above mentioned problems, JP-A-6-232457 proposes a method that an electronic component is covered by coating resin having good wettability in advance and sealing resin covers the coating resin. However, this method needs processes of coating the coating resin and drying it, thereby resulting in increases of the processing cost and material cost.

SUMMARY OF THE INVENTION

The present invention has been made in view of the above-mentioned problems and an object of the present invention is to provide a method of producing a resin-sealed electronic device including an electronic component with high reliability for a long time. More particularly, an object of the present invention is to provide a method of sealing an electronic component with good adhesive properties of sealing resin.

According to the present invention, a solder resist layer including a silicone family surfactant, a content of which is less than 3 wt %, is coated on a circuit board. An electronic component is mounted on the solder resist layer, and is sealed by sealing resin. More preferably, the content of the silicone family surfactant in the solder resist layer is in a range of 0.2 wt % to 1 wt %. As a result, adhering strength of the sealing resin relative to the solder resist layer is enhanced, so that reliability of the electronic component can be ensured for a long time. In addition, pin-holes do not occur in the solder resist layer, and leveling of the solder resist layer can be improved.

The surface portion of the solder resist layer may be removed by polishing. Accordingly, the content of the silicone family surfactant in an exposed surface portion of the solder resist layer can be controlled to be less than 3 wt %, more preferably to in a range of 0.2 et % to 1 wt %.

Further, the circuit board may include the silicone family surfactant. In the case where the content of the silicone family surfactant in the circuit board is less than 3 wt %, adhering strength of the sealing resin relative to the circuit board is enhanced, thereby resulting in high reliability of the electronic component for a long time. More preferably, the content of the silicone family surfactant in the circuit board is in a range of 0.2 wt % to 1 wt %. The surface portion of the circuit board may be removed to control the content of the silicone family surfactant by polishing by utilizing abrasive grains.

The content of the silicone family surfactant can be calculated on the basis of a content of silicon analyzed by the XPS. Further, it is preferable that epoxy resin or phenol resin is employed as the sealing resin. Accordingly, reliability of connecting portions between the electronic component and the circuit board can be ensured. As base material of the circuit board, glass-epoxy base material or paper-phenol base material may be adopted.

BRIEF DESCRIPTION OF THE DRAWINGS

Other objects and features of the present invention will become more readily apparent from a better understanding of the preferred embodiments described below with reference to the following drawings.

FIG. 1 is a cross-sectional view showing a resin-sealed electronic device in a first embodiment according to the present invention;

FIGS. 2A to 2C are cross-sectional views for explaining processes of manufacturing the resin-sealed electronic device in the first embodiment;

DETAILED DESCRIPTION OF THE PREFERRED EMBODIMENTS

Figure 3:
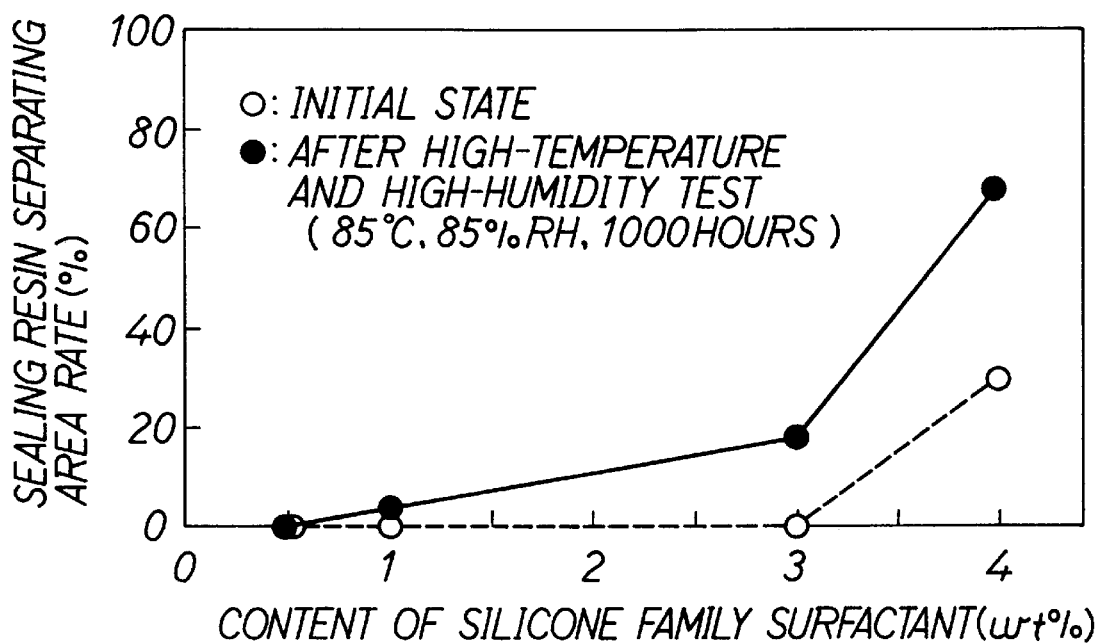
FIG. 3 is a graph showing relationships between contents of silicone family surfactant in solder resist and delaminated area rates of sealing resin relative to the solder resist in the first embodiment.

Embodiments according to the present invention will be described hereinunder with reference to the drawings.

(First Embodiment)

In a resin-sealed electronic device shown in FIG. 1, solder resist layer 2 is coated on a printed circuit board 1 through a patterned copper layer 5, and an electronic component 3 (such as a silicon chip or the like) is fixed to the printed circuit board 1 through the solder resist layer 2 and adhesives 4. The electronic component 3 is electrically connected, by utilizing bonding wires 6, to the copper layer 5 which is partially covered by the solder resist layer 2. Further, sealing resin 7 is disposed on the surface of the solder resist layer 2 as well as on the electronic component 3 to seal the electronic component 3 and the bonding wires 6.

The solder resist layer 2 includes a silicone family surfactant of 3 wt % at most. Preferably, the content of the silicone family surfactant in the solder resist layer 2 is in a range of 0.2 wt % to 1 wt %. The silicone family surfactant which is denoted by reference numeral 8 (indicated by white triangles) in FIG. 1 functions as an antifoaming agent. Employed as the sealing resin 7 is epoxy resin. Phenol resin can be adopted as the sealing resin 7 in place of the epoxy resin.

Next, a method of manufacturing the resin-sealed electronic device will be explained. As shown in FIG. 2A, the patterned copper layer 5 is formed on the printed circuit board 1. Thereafter, as shown in FIG. 2B, the solder resist layer 2 is coated on the copper layer 5 to cover a part of the copper layer 5. In more detail, liquid resist material is coated on the copper layer 5, and then, it is hardened by heating or by ultraviolet irradiation, thereby forming the solder resist layer 2. This solder resist layer 2 includes the silicone family surfactant 8 in the range of 0.2 wt % to 1 wt %.

Subsequently, as shown in FIG. 2C, the electronic component 3 is mounted on the printed circuit board 1 through the solder resist layer 2 and the adhesives 4, and wire bonding process is performed with respect to the electronic component 3. Finally, the electronic component 3 is sealed by the sealing resin 7 (epoxy resin or phenol resin), so that the resin-sealed electronic device shown in FIG. 1 is obtained.

FIG. 3 shows relationships between the contents of the silicone family surfactant 8 in the solder resist layer 2 and delaminated area rates of the sealing resin 7 relative to the surface of the solder resist layer 2. To evaluate the delaminated area rates of the sealing resin 7, the resin-sealed electronic device is left in an atmosphere of high temperature (85° C.) and high humidity (85 %RH), for 1000 hours. As indicated in FIG. 3, as the content of the silicone family surfactant 8 increases, the delaminated area rate of the sealing resin 7 increases. In particular, the delaminated area rate of the sealing resin 7 suddenly increases when the content of the silicone family surfactant exceeds 3 wt %.

Figure 4:
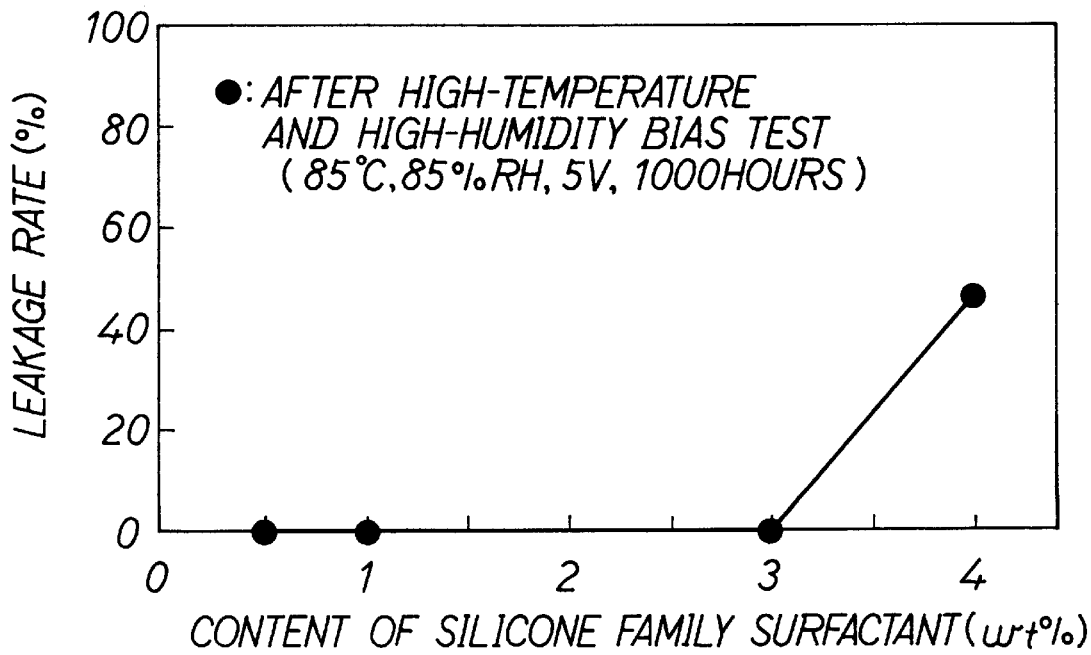
FIG. 4 is a graph showing relationships between the contents of the silicone family surfactant in the solder resist and leakage failure rates in the first embodiment.

FIG. 4 shows relationships between the contents of the silicone family surfactant 8 in the solder resist layer 2 and leakage failure rates of the electronic component 3. The leakage failure rates are obtained by a leakage test after a high-temperature and high-humidity bias test. As indicated in FIG. 4, as the content of the silicone family surfactant increases, the leakage failure rate increases. In particular, the leakage failure rate suddenly increases when the content of the silicone family surfactant exceeds 3 wt %.

According to the results, it is assumed that the increase of the content of the silicone family surfactant 8 is accompanied by the increase of the delaminated area rate of the sealing resin 7 to the solder resist layer 2, so that water invades the separated portions between the sealing resin 7 and the solder resist layer 2, resulting in high leakage failure rate.

The first embodiment described above has the following features.

(A) The electronic component 3 is mounted on the printed circuit board 1 through the solder resist layer 2 and the copper layer 5 coated on the printed circuit board 1 to be sealed by the sealing resin 7. The solder resist layer 2 includes the silicone family surfactant 8 of 3 wt % at most, and the sealing resin 7 is disposed on the sealing resist layer 2 as well as on the electronic component 3. Because of this, the adhering strength between the sealing resin 7 and the surface of the solder resist layer 2 becomes large. As a result, high reliability of the electronic component 3 can be ensured for a long time.

(B) Because the silicone family surfactant 8 which functions as the antifoaming agent is added to the solder resist layer 2 at 3 wt % at most (more preferably in the range of 0.2 wt % to 1 wt %), pin-holes do not occur in the solder resist layer 2. In addition, the leveling of the solder resist layer 2 can be ameliorated. In a case where the content of the silicone family surfactant 8 is less than 0.2 wt %, the silicone family surfactant 8 cannot function as the antifoaming agent.

(C) The epoxy resin or the phenol resin, thermal expansion coefficient of which is smaller than that of silicone resin, is used as the sealing resin 7. Because of this, in the case where the electronic component 3, such as a semiconductor device composed of a silicon chip or the like, is mechanically and electrically connected to electrodes formed on the printed circuit board 1, distortion caused in the connecting portions between the electronic component 3 and the electrodes becomes small, thereby resulting in high reliability of the connecting portions for a long time. In addition, both of the epoxy resin and the phenol resin have elastic moduli enough for protecting the electronic component 3 from a mechanical impact applied from the outside.

(Second Embodiment)

Figure 5:
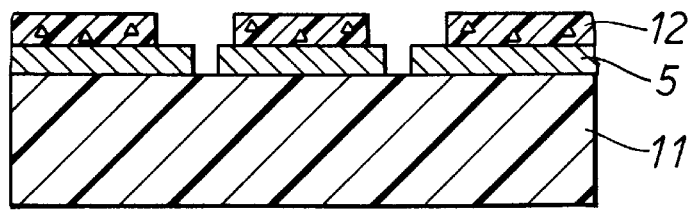
FIGS. 5 to 7 are cross-sectional views for explaining processes of manufacturing a resin-sealed electronic device in a second embodiment according to the present invention.

In a second embodiment, as shown in FIG. 5, the patterned copper layer 5 is formed on a printed circuit board 11 including glass-epoxy base material, and a solder resist layer 12 added with the silicone family surfactant is coated on the copper layer 5.

Thereafter, the surface of the solder resist layer 12 is polished (scrubbed) by spraying abrasive grains by utilizing a jet scrubber so that the surface portion thereof including the silicone family surfactant seeped out is removed. Here, employed as the abrasive grains are glass beads which have passed through a sieve of 240 mesh, and a pressure of the jet scrubber is preferably 2 kg/cm$^2$. Usually, the scrubbing treatment utilizing the jet scrubber is performed on the copper layer on which the solder resist does not lie in order to remove contaminants on the copper layer. In the second embodiment, the time of this scrubbing treatment is lengthened to remove the surface portion of the solder resist layer 12 at the same time.

By performing this treatment, the content of the silicone family surfactant included in the solder resist layer 12 is controlled to be equal to or less than 3 wt %, more preferably to be in the range of 0.2 wt % to 1 wt %. The content of the silicone family surfactant in the surface portion of the solder resin 12 can be calculated on the basis of a content of silicon included therein which can be analyzed by an X-ray photoelectron spectroscopy (XPS).

Figure 6:
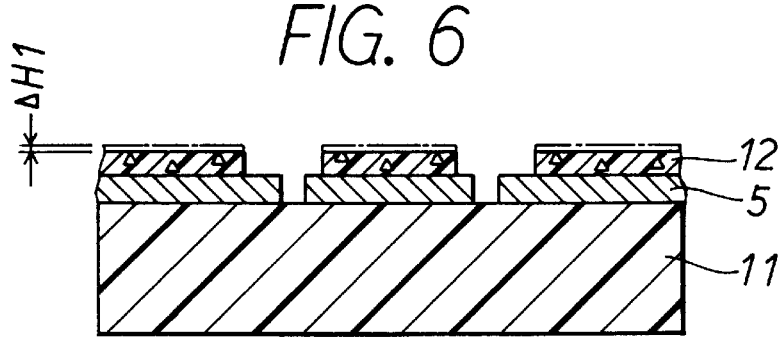
Figure 9B:
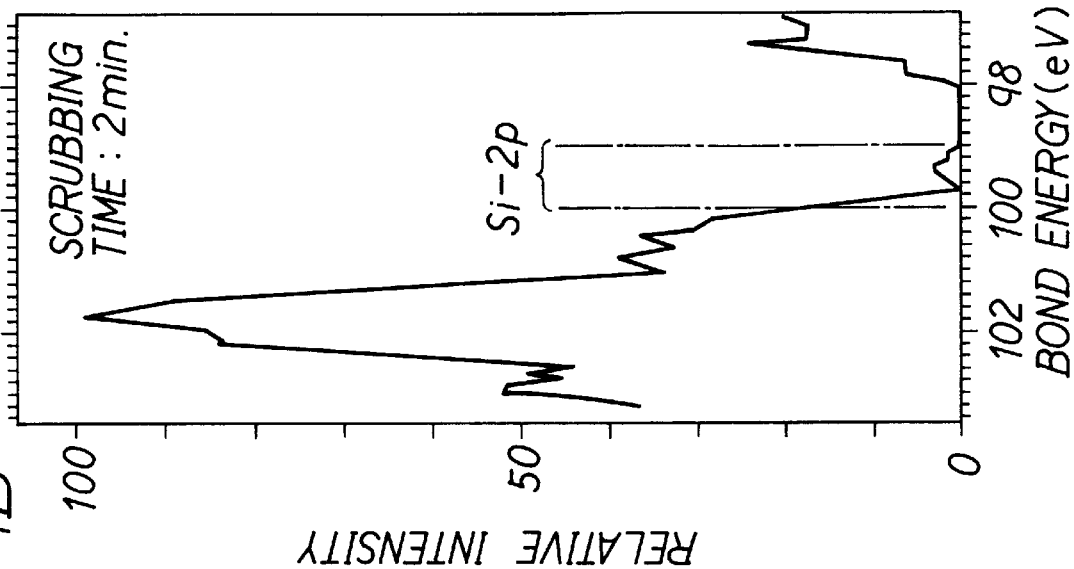
FIGS. 9A and 9B are graphs showing results of analysis by the XPS.
Figure 9A:
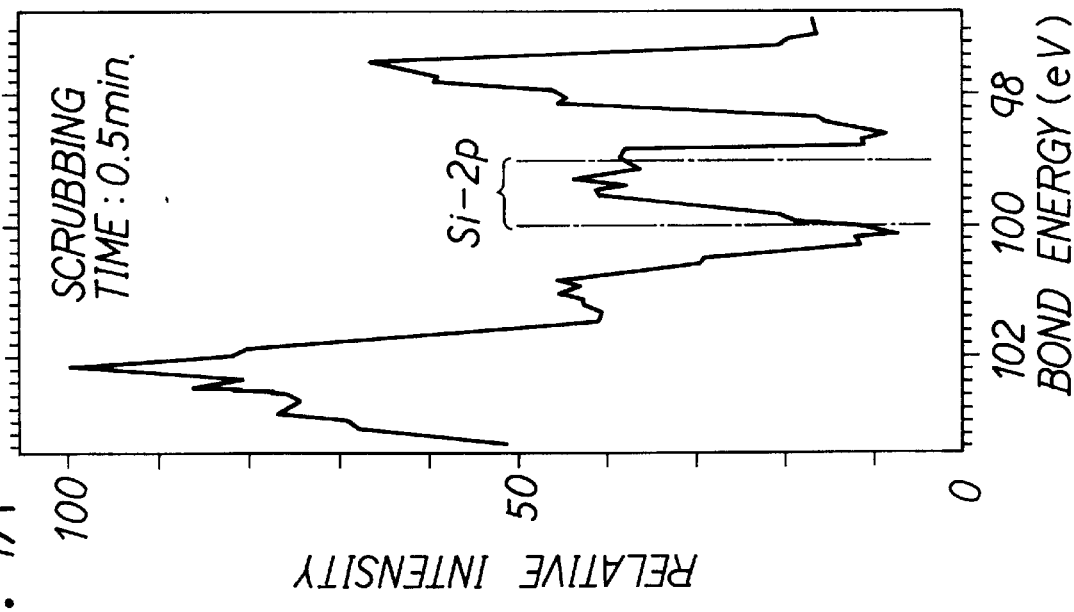

For example, the surface of the solder resist layer 12 is polished (scrubbed) by spraying the adhesive grains for 0.5 minute so that the surface portion thereof is removed by a thickness ΔH1 as shown in FIG. 6. Thereafter, the exposed surface of the solder resist layer 12 is analyzed by the XPS. An example of the result is indicated in FIG. 9A. On the basis of a relative intensity of a spectrum peak corresponding to Si-2p, i. e., having the range of the bond energy of approximately 99 eV to 100 eV, the content of the silicon is calculated. From the content of the silicon, it is known that the content of the silicone family surfactant is more than 3 wt %.

Figure 7:
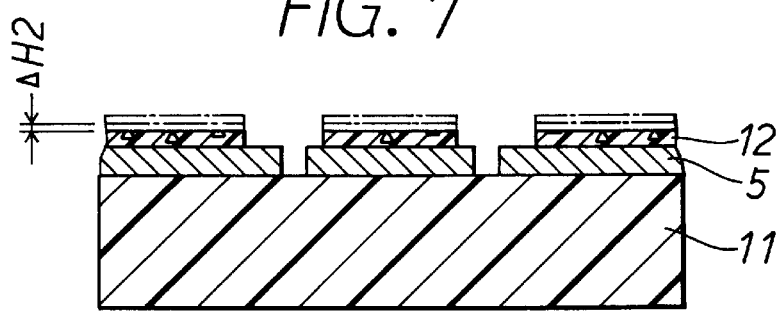

Therefore, as shown in FIG. 7, the surface of the solder resist layer 12 is further scrubbed for 1.5 minutes so that the surface portion thereof is removed by a thickness ΔH2. Thereafter, the exposed surface of the solder resist layer 12 is analyzed by the XPS as well. The obtained spectrum is shown in FIG. 9B. In this state, the content of the silicone family surfactant calculated from the content of the silicon is less than 3 wt %. Therefore, the surface of the solder resist layer 12 is not removed anymore. That is, when the spectrum shown in FIG. 9A is obtained by the XPS, the adhering reliability of the sealing resin to the solder resist cannot be improved. As opposed to this, when the spectrum shown in FIG. 9B is obtained by the XPS, the adhering reliability of the sealing resin to the solder resist can be improved.

Figure 8:
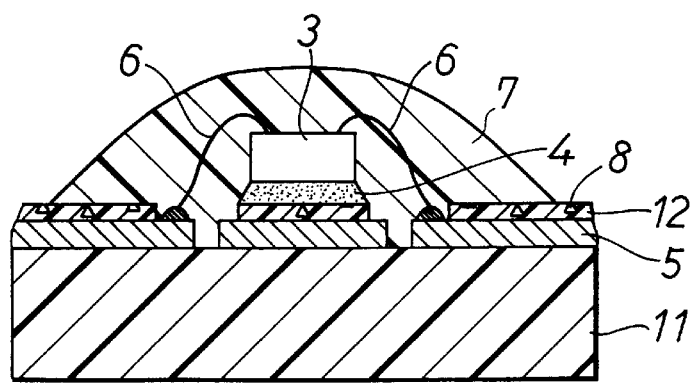
FIG. 8 is a cross-sectional view showing the resin-sealed electronic device in the second embodiment.

As a next step, the electronic component 3 is mounted on the surface of the solder resist layer 12 of which the surface portion has been removed, through the adhesives 4, and wire bonding process is performed with respect to the electronic component 3. Finally, the electronic component 3 is sealed by the sealing resin 7 made of epoxy resin or phenol resin as shown in FIG. 8.

Figure 10:
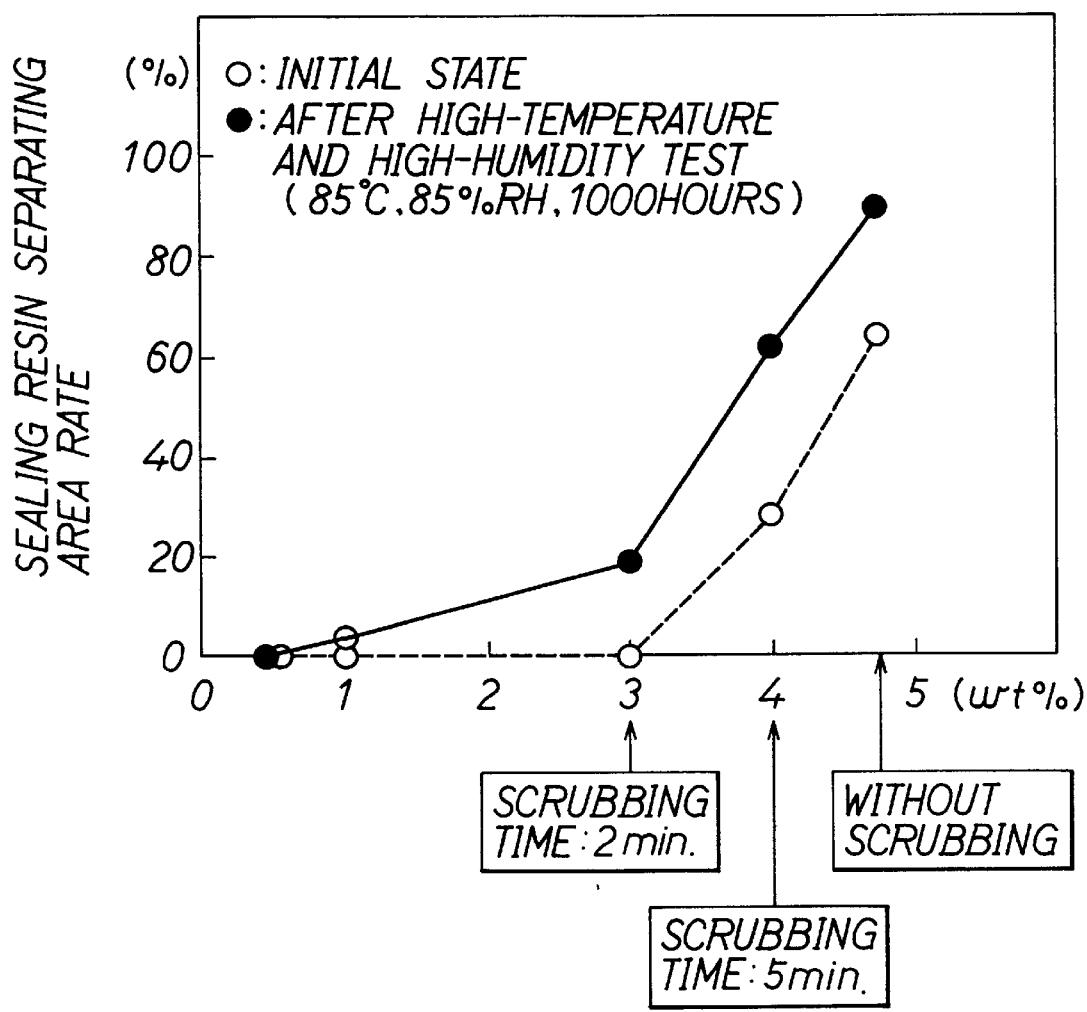
FIG. 10 is a graph showing relationships between contents of silicone family surfactant in solder resist and delaminated area rate of sealing resin relative to the solder resist in the second embodiment.

FIG. 10 shows relationships between the contents of the silicone family surfactant included in the surface portion of the solder resist layer 12 and the delaminated area rates of the sealing resin 7 to the solder resist layer 12. The contents of the silicone family surfactant were calculated on the basis of the analytic results by the XPS, and the delaminated area rates of the sealing resin 7 were evaluated after leaving in the high-temperature and high-humidity (85° C., 85 %RH) atmosphere for 1000 hours. According to the results, in the case where the polishing (scrubbing) treatment is performed with respect to the solder resist layer 12 for 2 minutes, the content of the silicone family surfactant becomes less than 3 wt %, and the delaminated area rate of the sealing resin 7 becomes less than 20%. Consequently, the adhering reliability of the sealing resin 7 can be remarkably improved.

As mentioned above, the second embodiment has the following features. That is, after coating the solder resist layer 12 including the silicone family surfactant on the printed circuit board 11 through the copper layer 5, the surface of the solder resist layer 12 is scrubbed so that the surface portion thereof including silicone family surfactant seeped out is removed. Accordingly, the content of the silicone family surfactant included in the surface portion of the solder resin 12 is controlled to be 3 wt % at most. The content of the silicone family surfactant is calculated from the content of the silicon which is analyzed by the XPS. Thereafter, the electronic component 3 is mounted on the solder resist layer 12, and it is sealed by the sealing resin 7. As a result, the adhering strength between the sealing resin 7 and the solder resist layer 12 becomes large, thereby resulting in high adhering reliability of the electronic component 3 for a long time.

(Third Embodiment)

Figure 11:
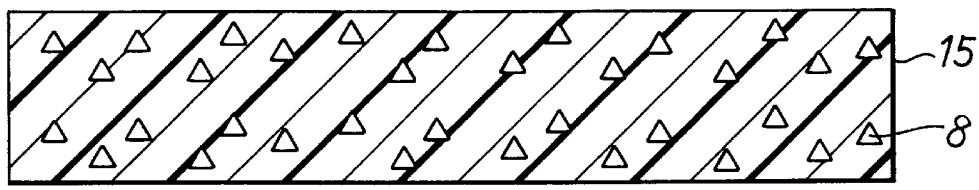
FIGS. 11 to 13 are cross-sectional views for explaining processes of manufacturing a resin-sealed electronic device in a third embodiment according to the present invention.

As shown in FIG. 11, a circuit board 15 made of glass-epoxy base material including the silicone family surfactant 8 is prepared. The surface of the circuit board 15 is polished (scrubbed) by the jet scrubber or the like, so that the surface portion of the circuit board 15, which includes the silicone family surfactant seeped out thereto, is removed. Accordingly, the content of the silicone family surfactant in the surface portion of the circuit board 15 is controlled to be 3 wt % at most, more preferably to be in the range of 0.2 wt % to 1 wt %. The content of the silicone family surfactant is calculated on the basis of the content of silicon analyzed by the XPS.

Figure 12:
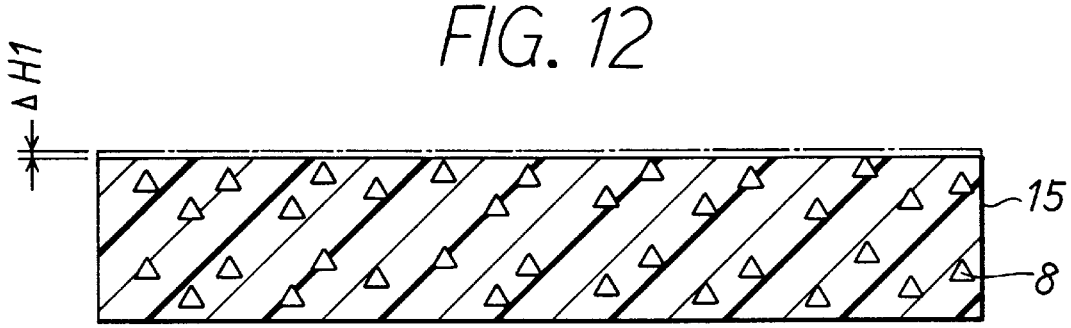
Figure 13:
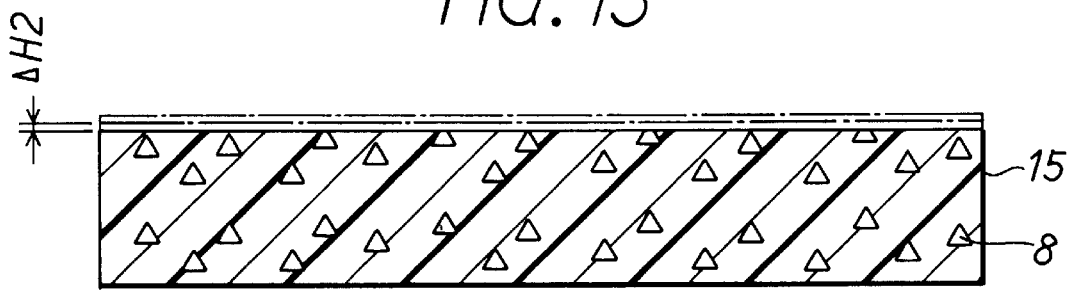

That is, as shown in FIG. 12, the surface of the circuit board 15 is scrubbed for 0.5 minute so that the surface portion thereof is removed by a thickness ΔH1, and the exposed surface is analyzed by the XPS. In the case where the content of the silicone family surfactant in the surface portion of the circuit board 15 is more than 3 wt %, the surface of the circuit board 15 is further scrubbed, for example, for 1.5 minutes so that the surface portion thereof is removed by a thickness ΔH2 as shown in FIG. 13. Thereafter, the surface of the circuit board 15 is analyzed by the XPS as well. When the content of the silicones family surfactant is less than 3 wt %, the polishing (scrubbing) treatment is stopped.

Figure 14:
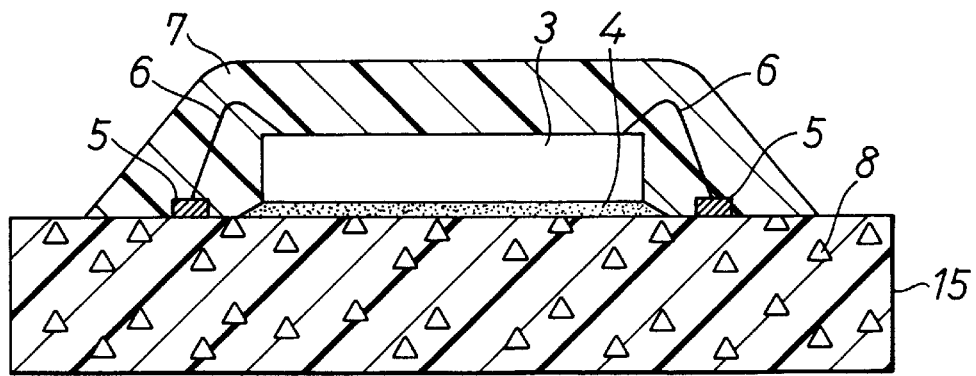
FIG. 14 is a cross-sectional view showing the resin-sealed electronic device in the third embodiment.
Figure 15:
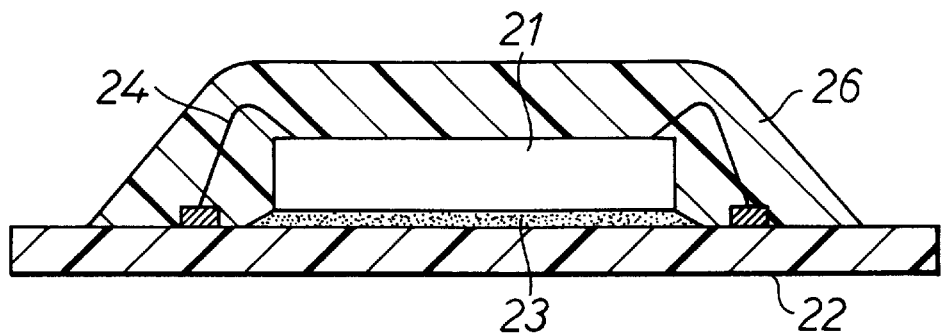
FIG. 15 is a cross-sectional view showing a resin-sealed electronic device according to a prior art.

Subsequently, the electronic component 3 is mounted on the circuit board 15 through the adhesives 4, and wire bonding process is performed with respect to the electronic component. Finally, as shown in FIG. 14, the electronic component 3 is sealed by the sealing resin 7 made of epoxy resin or phenol resin.

The third embodiment has the following features. That is, the silicone family surfactant is added to the circuit board 15 instead of to the solder resist, and the content of the silicone family surfactant included in the surface portion of the circuit board 15 is controlled to be 3 wt % at most by the scrubbing treatment. In this state, the sealing resin 7 is disposed on the circuit board 15 as well as on the electronic component 3 mounted on the circuit board 15. As a result, the adhering strength between the sealing resin 7 and the circuit board 15 becomes large, thereby resulting in high reliability of the electronic component 3 for a long time.

Figure 16:
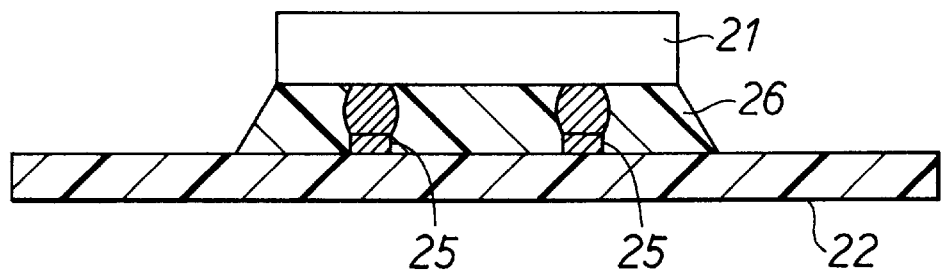
FIG. 16 is a cross-sectional view showing another resin-sealed electronic device according to a prior art.
Figure 17:
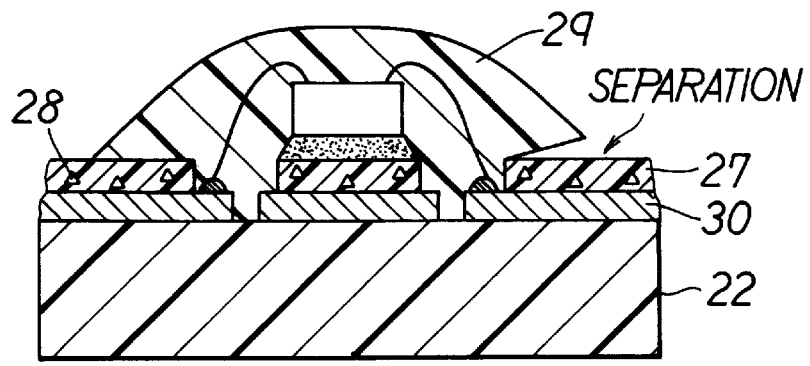
FIG. 17 is a cross-sectional view showing another resin-sealed electronic device according to a prior art.

In the above mentioned embodiments, the sealing resin 7 entirely covers the electronic component 3 and the bonding wires 6 so as to seal the electronic component 3. However, the present invention can be adopted to the other structure. For example, in the case where a flip chip is employed as an electronic component 21 as shown in FIG. 16, the electronic component 21 is mounted on a circuit board 22 through bumps. In this case, the sealing resin 7 according to the present invention can be disposed between the electronic component 21 and the circuit board 22 so as to cover bumps.

On the basis of the present invention, various experiments were performed. The results are shown in TABLE 1.

TABLE 1

| | | comparative example 1 | comparative example 2 | embodied example 1 | embodied example 2 | embodied example 3 | embodied example 4 | embodied example 5 |
|---|---|---|---|---|---|---|---|---|
| sealing resin | material | phenol | silicone | epoxy | epoxy | epoxy | phenol | epoxy |
| | thermal expansion coefficient (ppm/° C.) | 24 | 300 | 17 | 17 | 17 | 24 | 17 |
| type of base material of circuit board | | glass-epoxy | glass-epoxy | glass-epoxy | glass-epoxy | paper-phenol | glass-epoxy | glass-epoxy |
| solder resist | method of hardening | UV + heating | UV + heating | UV + heating | UV + heating | UV + | UV + heating | UV + heating |
| | content of silicone family surfactant (%) | 4.0 | 3.0 | 3.0 | 1.0 | 1.0 | 0.5 | 4.0 |
| | scrubbing treatment time (min.) | 0.5 | 0.5 | 0.5 | 1 | 1 | 2 | 2 |
| delaminated area rate of sealing resin (%) | initial state | 30 | 0 | 0 | 0 | 0 | 0 | 0 |
| | after high-temperature, high humidity storage test: 85° C., 85% RH, 1000 hours | 70 | 0 | 18 | 5 | 5 | 0 | 5 |
| leakage failure rate (%) (after high-temperature, high-humidity storage test: 85° C., 85% RH, 1000 hours) | | 47 | 0 | 12 | 0 | 0 | 0 | 0 |
| open failure rate (%) (after thermal shock cycle test: −40° C.–125° C., 1000 cycles) | | 5 | 20 | 0 | 0 | 0 | 0 | 0 |

In a comparative example 1, the phenol resin having the thermal expansion coefficient of 24 ppm/° C. was employed as the sealing resin, and glass-epoxy base material was adopted to the circuit board. The solder resist was hardened by ultraviolet irradiation and heating, and included the silicone family surfactant of 4.0 wt %. In addition, the scrubbing treatment was performed with respect to the solder resist for 0.5 minutes. In this case, the delaminated area rate of the sealing resin relative to the solder resist in the initial state after hardening the sealing resin was 30%. The delaminated area rate and the leakage failure rate after the high-temperature and high-humidity (85° C., 85 %RH) storage test for 1000 hours were 70% and 47%, respectively. Further, a thermal shock cycle test was performed between −40° C. and 125° C., and an open failure rate in an open failure test after 1000 cycles of this test was 5%. In the comparative example 1, because the content of the silicone family surfactant was 4 wt %, the delaminated area rate of the sealing resin relative to the solder resist was remarkably increased by the high-temperature and high-humidity storage test, resulting in the high leakage failure rate.

In a comparative example 2, a silicone resin having the thermal expansion coefficient of 300 ppm/° C. was employed as the sealing resin, and the solder resist included the silicone family surfactant of 3 wt %. The other conditions were the same as those in the comparative example 1. In this case, the delaminated area rate of the sealing resin relative to the solder resist in the initial state after hardening the sealing resin was substantially 0%, and the delaminated area rate did not change by the high-temperature and high-humidity storage test for 1000 hours. The leakage failure rate was also 0%. However, the open failure rate after the thermal shock cycle test of 1000 cycles was 20%. Thus, in the comparative example 2, by leaving in the high-temperature and high-humidity atmosphere for 1000 hours, no separation between the sealing resin and the solder resist occurred. However, because the sealing resin was the silicone resin having large thermal expansion coefficient, thermal fatigue fracture occurred at the connecting portions of the bonding wires, thereby resulting in cutoffs of the connecting portions.

In addition, embodied examples 1 to 5 to which the present invention, more particularly the second embodiment, was applied were tested. In the embodied example 1, employed as the sealing resin was the epoxy resin having the thermal expansion coefficient of 17 ppm/° C. The solder resist included the silicone family surfactant of 3 wt %, and was hardened by ultraviolet irradiation and heating. Thereafter, the surface of the solder resist was scrubbed for 0.5 minute. In this case, the delaminated area rate of the sealing resin relative to the solder resist in the initial state was substantially 0%, and the delaminated area rate after the high-temperature and high-humidity storage test was 18%. The leakage failure rate after the high-temperature and high-humidity storage test was 12%, and the open failure rate after the thermal shock cycle test was substantially 0%. In the embodied example 1, because the epoxy resin having small thermal expansion coefficient was employed, thermal stress caused at the connecting portions of the bonding wires was mitigated. As a result, the open failure rate could be hold at 0%. In addition, because the content of the silicone family surfactant in the solder resist was 3 wt %, the separation of the sealing resin did not occur in the initial state. However, the delaminated area rate of the sealing resin was increased by the high-temperature and high-humidity storage test.

In the embodied example 2, the content of the silicone family surfactant in the solder resist was 1.0 wt %, and the scrubbing treatment was performed with respect to the surface of the solder resist hardened for 1 minute. The other conditions were the same as those in the embodied example 1. In this case, the delaminated area rate of the sealing resin to the solder resist in the initial state was substantially 0%, and the delaminated area rate after the high-temperature and high-humidity storage test was 5 wt %. The leakage failure rate after the high-temperature and high-humidity storage test and the open failure rate after the thermal shock cycle test were 0%, respectively.

In the embodied example 3, paper-phenol base material was adopted to the circuit board in place of glass-epoxy base material. The other conditions were the same as those in the embodied example 2. In this case, the delaminated area rate in the initial state was 0%, and the delaminated area rate after the high-temperature and high-humidity storage test was 5%. The leakage failure rate after the high-temperature and high-humidity storage test and the open failure rate after the thermal shock cycle test were 0%, respectively.

In the embodied example 4, the phenol resin having the thermal expansion coefficient of 24 ppm/° C. was employed as the sealing resin, and glass-epoxy base material was adopted to the circuit board. The solder resist included the silicone family surfactant of 0.5%. The scrubbing treatment was performed on the solder resist for 2 minutes. In this case, the delaminated area rates in the initial state and after the high-temperature and high-humidity storage test were 0%, respectively. The leakage failure rate after the high-temperature and high-humidity storage test and the open failure rate after the thermal shock cycle test were also 0%, respectively. In the embodied example 4, because the phenol resin having small thermal expansion coefficient was employed as the sealing resin, thermal stress caused at the connecting portions of the bonding wires was mitigated. As a result, the open failure rate after the thermal shock cycle test could be held at 0%.

In the embodied examples 2, 3, and 4, because the content of the silicone family surfactant was less than 1 wt %, even after the high-temperature and high-humidity storage test for 1000 hours, the delaminated area rate of the sealing resin to the solder resist was small.

In the embodied example 5 in TABLE 1, the epoxy resin was employed as the sealing resin, and glass-epoxy base material was adopted to the circuit board. The content of the silicone family surfactant in the solder resist was 4.0 wt %, and the scrubbing treatment time performed on the solder resist was 2 minutes. In this case, the delaminated area rate of the sealing resin in the initial state was 0%, and the delaminated area rate after the high-temperature and high-humidity storage test was 5%. The leakage failure rate after the high-temperature and high-humidity storage test, and the open failure rate after the thermal shock cycle test were 0%, respectively. According to the result of the embodied example 5, it is known that, even if the content of the silicone family surfactant in the solder resist is 4 wt %, the increase of the delaminated area rate of the sealing resin to the solder resist by the high-temperature and high-humidity storage test can be prevented by performing the scrubbing treatment sufficiently. That is, the content of the silicone family surfactant in the surface portion of the solder resist is controlled to be less than 0.3 wt % by performing the scrubbing treatment sufficiently.

According to the results indicated in TABLE 1, in the case where the content of the silicone family surfactant in the solder resist is equal to or less than 3 wt %, the separation of the sealing resin relative to the solder resist does not occur in the initial state (just after hardening the sealing resin). The silicone family surfactant is seeped out to the surface portion of the solder resist in the forming process of the solder resist to hinder the adhesion relative to the sealing resin. In this case, by performing the scrubbing treatment with respect to the solder resist sufficiently, the silicone family surfactant seeped out to the surface portion of the solder resist can be removed. As a result, even if the content of the silicone family surfactant exceeds 3 wt %, the increase of the delaminated area rate of the sealing resin by the high-temperature and high-humidity storage test can be prevented effectively.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of producing a resin-sealed electronic device, comprising the steps of:

forming a solder resist layer on a circuit board, the solder resist layer including a silicone family surfactant, a content of the silicone family surfactant in the solder resist layer being less than 3 wt %;

fixing an electronic component on the solder resist layer; and sealing the electronic component by sealing resin such that at least part of the sealing resin is fixed to the circuit board through the solder-resist layer.

2. A method of producing a resin-sealed electronic device according to claim 1, wherein;

the content of the silicone family surfactant in the resist layer is in a range of 0.2 wt % to 1 wt %.

3. A method of producing a resin-sealed electronic device, comprising the steps of:

forming a solder resist layer on a circuit board, the solder resist layer including a silicone family surfactant;

removing a surface portion of the solder resist layer;

fixing an electronic component on the solder resist layer; and sealing the electronic component by sealing resin.

4. A method of producing a resin-sealed electronic device according to claim 3, wherein;

the surface portion removing step is continued until an exposed surface portion of the solder resist layer includes the silicone family surfactant of less than 3 wt %.

5. A method of producing a resin-sealed electronic device according to claim 4, wherein;

the surface portion removing step is continued until the exposed surface portion of the solder resist layer includes the silicone family surfactant in a range of 0.2 wt % to 1 wt %.

6. A method of producing a resin-sealed electronic device according to claim 4, wherein;

a content of the silicone family surfactant is calculated on the basis of a content of silicon, and the content of silicon is analyzed by a x-ray photoelectron spectroscopy.

7. A method of producing a resin-sealed electronic device according to claim 3, wherein;

the surface portion removing step includes a step of polishing the surface portion of the solder resist layer by abrasive grains.

8. A method of producing a resin-sealed electronic device according to claim 3, wherein;

the circuit board includes glass-epoxy base material.

9. A method of producing a resin-sealed electronic device according to claim 3, wherein;

the circuit board includes paper-phenol base material.

10. A method of producing a resin-sealed electronic device according to claim 3, wherein;

the sealing resin includes epoxy resin.

11. A method of producing a resin-sealed electronic device according to claim 3, wherein;

the sealing resin includes phenol resin.

12. A method of producing a resin-sealed electronic device according to claim 3, wherein;

the circuit board has a patterned copper layer;

the solder resist layer is formed on a part of the patterned copper layer; and contaminants on the copper layer other than the part on which the solder resist layer is formed are removed in the step of removing the surface portion of the solder resist layer at the same time.

13. A method of producing a resin-sealed electronic device having a circuit board, comprising the steps of:

removing a surface portion of the circuit board including a silicone family surfactant;

mounting an electronic component on the circuit board; and sealing the electronic component by sealing resin.

14. A method of producing a resin-sealed electronic device according to claim 13, wherein;

the surface portion removing process is continued until a content of the silicone family surfactant in an exposed surface portion of the circuit board becomes less than 3 wt %.

15. A method of producing a resin-sealed electronic device according to claim 14, wherein;

the surface portion removing process is continued until the content of the silicone family surfactant in the exposed surface portion of the circuit board becomes in a range of 0.2 wt % to 1 wt %.

16. A method of producing a resin-sealed electronic device according to claim 13, wherein;

the surface portion removing step includes a step of polishing the surface portion of the circuit board by abrasive grains.

17. A method of producing a resin-sealed electronic device according to claim 13, wherein;

the circuit board includes glass-epoxy base material.

18. A method of producing a resin-sealed electronic device according to claim 13, wherein;

the circuit board includes paper-phenol base material.

19. A method of producing a resin-sealed electronic device according to claim 13, wherein;

the sealing resin includes epoxy resin.

20. A method of producing a resin-sealed electronic device according to claim 13, wherein;

the sealing resin includes phenol resin.

21. A method of producing a resin-sealed electronic device, comprising steps of:

preparing a circuit board having a mounting surface region for mounting an electronic component thereon and a sealing surface region for contacting a sealing resin, the sealing surface region being provided around the mounting surface region and including a silicone family surfactant with a content being less than 3 wt %, the sealing resin being for sealing the electronic component therein;

fixing the electronic component on the mounting surface region; and sealing the electronic component with the sealing resin such that the sealing resin directly contacts the sealing surface region at a periphery thereof.

22. A method of producing a resin-sealed electronic device according to claim 21, wherein the sealing surface region is provided by forming a solder resist layer including the silicone family surfactant on the sealing surface region of the circuit board.

23. A method of producing a resin-sealed electronic device according to claim 21, wherein the circuit board is made of material including the silicone family surfactant to provide the sealing surface region on a surface thereof.

24. A method of producing a resin-sealed electronic device according to claim 21, wherein an initial surface region of the circuit board is removed to provide the sealing surface region.

25. A method of producing a resin-sealed electronic device according to claim 21, wherein the content of the silicone family surfactant is in a range of 0.2 wt % to 1 wt %.

* * * * *